United States Patent [19]

Oshikawa

[11] Patent Number: 4,517,732
[45] Date of Patent: May 21, 1985

[54] METHOD FOR FABRICATING AN EEPROM

[75] Inventor: Yoshihiro Oshikawa, Yokohama, Japan

[73] Assignee: Fujitsu Limited, Kanagawa, Japan

[21] Appl. No.: 538,884

[22] Filed: Oct. 4, 1983

[30] Foreign Application Priority Data

Oct. 5, 1982 [JP] Japan .................................. 57-174776

[51] Int. Cl.³ .......................................... H01L 21/265
[52] U.S. Cl. .................................... 29/571; 29/576 B; 29/577 C; 29/578; 148/187; 148/188
[58] Field of Search ...................... 29/571, 578, 576 B, 29/577 C; 148/187, 188; 357/23 VT

[56] References Cited

U.S. PATENT DOCUMENTS

| 4,112,575 | 9/1978 | Fu et al. | 29/577 C |
| 4,218,267 | 8/1980 | Maddox | 148/187 X |
| 4,332,077 | 6/1982 | Hsu | 148/187 X |
| 4,409,723 | 10/1983 | Harari | 29/571 |
| 4,416,708 | 11/1983 | Abdoulin | 148/187 |

Primary Examiner—G. Ozaki
Attorney, Agent, or Firm—Armstrong, Nikaido, Marmelstein & Kubovcik

[57] ABSTRACT

A floating-gate tunnel-injection type EEPROM having an excellent quality tunneling insulating layer is fabricated by forming an impurity-doped region under the tunneling insulating layer by diffusion from a neighboring region. The impurity-doped region under the tunneling insulating layer does not have an edge under the tunneling insulating layer, thus ensuring excellent operation of the EEPROM.

6 Claims, 22 Drawing Figures

Fig. 9a
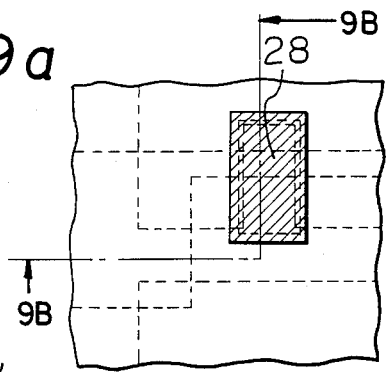
Fig. 9b
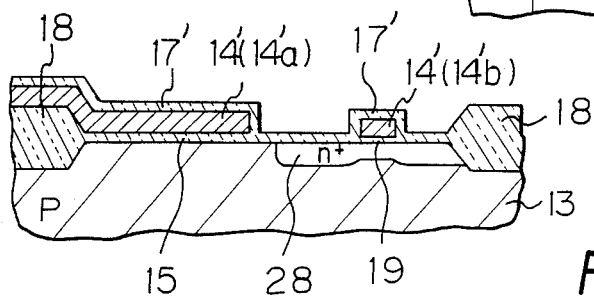
Fig. 10a
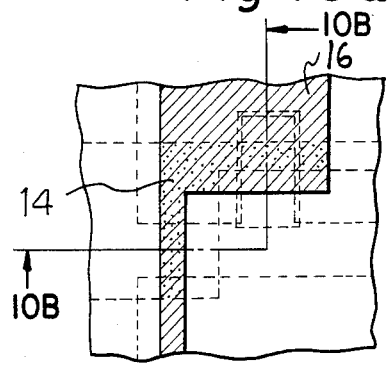
Fig. 10b

METHOD FOR FABRICATING AN EEPROM

BACKGROUND OF THE INVENTION

1. Field of the Invention

The present invention relates to a method for fabricating a semiconductor device, more specifically, a floating-gate tunnel-injection type electrically-erasable programmable read-only-memory device (EEPROM).

2. Description of the Prior Art

Semiconductor read only memories (ROM's) include mask ROM's and programmable ROM's (PROM's). Some PROM's are of the fuse type or diode junction breakage type in which information cannot be erased and rewritten after once being written, while others are of the erasable type (EPROM) in which information can be erased, for example, by ultraviolet rays and rewritten even after once being written.

Recently, EEPROM's have been developed. In EEPROM's, written information can be erased by electricity. EEPROM's include metal nitride oxide semiconductors (MNOS's), described in, for example, IEEE, "International Solid-state Circuit Conference WAM 3.6", 1976, Hagiwara T. et al, and floating-gate tunnel-injection type EEPROM's, described in, for example, "Electronics", McGraw-Hill Co., Feb. 28, 1980, pp. 113 to 117.

A floating-gate tunnel-injection type EEPROM has a structure similar to that of a metal oxide semiconductor (MOS) transistor, comprising a source, a drain, and a gate, but has above the gate which is floating a second gate and an extremely thin insulating layer for tunneling inserted between the floating gate and the drain. The thickness of the tunneling insulating layer is, for example, about 10 to 15 nm.

In this type of EEPROM, writing and erasing is effected by tunnel injection and discharge between the drain in the substrate and the floating gate through the tunneling insulating layer. Reading is effected by detecting conduction or nonconduction between the source and the drain according to presence or absence of charges in the floating gate.

The tunneling insulating layer must be both very thin and of a high quality. Formation of such a tunneling insulating layer, however, is difficult since the previous ion implantation used in the formation of the drain region in the substrate damages the surface of the substrate.

In another area, a floating-gate tunnel-injection type EEPROM has been proposed wherein the width of the overlap of the drain diffusion region and floating gate straddling a gate insulating layer is made smaller than the depth of the drain diffusion region so as to allow operation by less than rated power sources (see Japanese Unexamined Patent Publication (Kokai) No. 57-91560). In this EEPROM, the portion of the drain diffusion region just below the floating gate is formed by diffusing a dopant transversely from an outwardly neighboring region.

This EEPROM does not operate very well, however, since the edge of the drain diffusion region exists just below a very thin tunneling insulating layer. Though application of a high voltage between the floating gate and the drain diffusion region is preferable for tunnel injection and discharge therebetween, such a high voltage will cause junction breakdown of a pn junction when the insulating layer just over the edge of the junction is too thin.

SUMMARY OF THE INVENTION

The object of the present invention is to provide a floating-gate tunnel-injection type EEPROM having an excellent tunneling insulating layer and being able to operate well.

According to the invention, there is provided a method for fabricating a floating-gate tunnel-injection type EEPROM including the steps of: forming a tunneling insulating layer on a semiconductor substrate, forming a floating gate extending onto the tunneling insulating layer, and then introducing a doping impurity into a first region of the substrate neighboring the floating gate on the tunneling insulating layer as well as into an entire second region of the substrate just under the tunneling insulating layer by diffusion from the first region. The step of introducing the doping impurity into the first and second regions is preferably carried out by ion implantation into the first region with the use of the floating gate as a mask, followed by heat treatment so as to diffuse ions implanted in the first region into the entire second region.

BRIEF DESCRIPTION OF THE DRAWINGS

These and other objects, features, and advantages of the present invention will be more fully understood by the following explanation with reference to the accompanying drawings, wherein.

DESCRIPTION OF THE PREFERRED EMBODIMENTS

Figure 1:
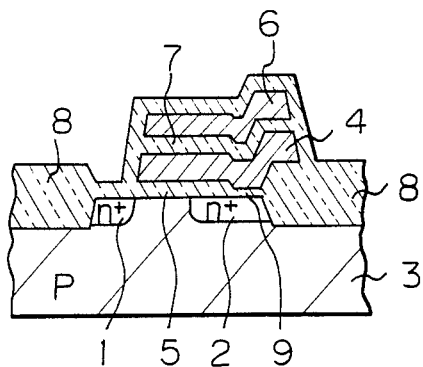
FIG. 1 is a sectional view of a prior art floating-gate tunnel-injection type EEPROM.

FIG. 1 illustrates a typical floating-gate tunnel-injection type EEPROM. This EEPROM has an n+-type source region 1 and an n+-type drain region 2 in a p-type semiconductor substrate 3, a floating gate 4, a gate insulating layer 5 on the substrate 3, a control gate 6, an insulating layer 7 between the two gates 4 and 6, and element isolation, for example, a field oxide layer 8. This EEPROM is characterized by a very thin tunneling insulating layer 9 between a part of the floating gate 4 and a part of the drain region 2.

Figure 2:
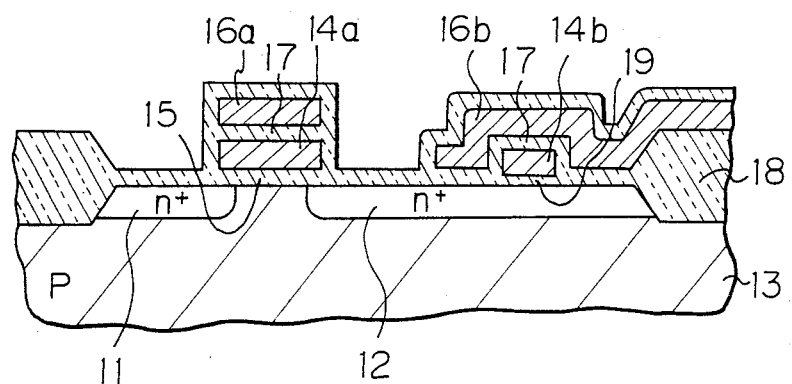
FIG. 2 is a sectional view of a modified prior art floating-gate tunnel-injection type EEPROM.

FIG. 2 illustrates a modified floating-gate tunnel-injection type EEPROM. This is similar to the EEPROM in FIG. 1, except that a floating gate 14 and a control gate 16 consist of reading portions 14a and 16a and writing and erasing portions 14b and 16b, which are separated but combined by a detour pattern (not shown in FIG. 2).

In FIG. 2, numeral 11 denotes an n+-type source region, 12 an n+-type drain region, 13 a p-type semiconductor substrate, 15 a gate insulating layer, 17 an insulating layer between the two gates 14 and 16, 18 a field oxide layer, and 19 a tunneling insulating layer.

The EEPROM of FIG. 2 operates in essentially the same manner as the EEPROM in FIG. 1, but features better characteristics. The present invention will therefore be explained with reference to FIG. 2.

In the usual fabrication of an EEPROM illustrated in FIG. 2, the tunneling insulating layer 19 is formed with a thickness of about 10 nm after effecting ion implantation into the substrate 13 to form the drain region 12. This ion implantation, however, damages the surface of the substrate 13, making it difficult to form an excellent thin insulating layer thereon.

FIGS. 3 to 11 illustrate an example of a process for fabricating a floating-gate tunnel-injection type EEPROM according to the present invention. In these figures, FIGS. X$a$ are plan views of a typical pattern in each process and FIGS. X$b$ are sectional views of the EEPROM of that process, taken along line B—B in FIG. 3$a$. The same parts as in FIG. 2 are denoted by the same reference numerals.

Figure 3A:
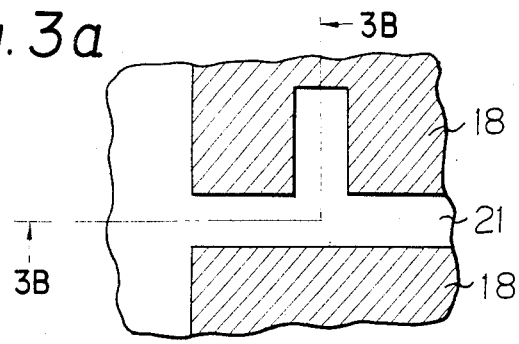
FIGS. 3a, b to 11a, b illustrate a process for fabricating an EEPROM according to the present invention, wherein FIGS. Xa are plan views and FIGS. Xb are sectional views.
Figure 3B:
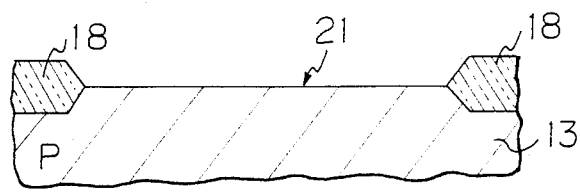

Referring to FIG. 3$a$ and 3$b$, the surface of the p-type silicon substrate 13 is oxidized, covered in a part by a silicon nitride layer, heat treated so as to form the field oxide layer 18 at a 700 nm to 1000 nm thickness, and etched to remove the silicon nitride layer, resulting in an active region 21 below the etched off layer.

Figure 4A:
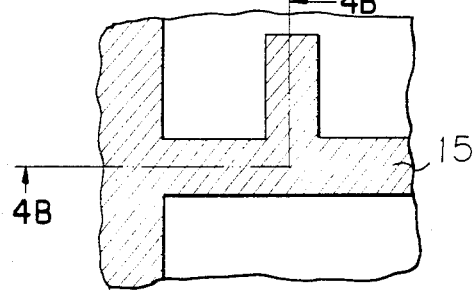
Figure 4B:
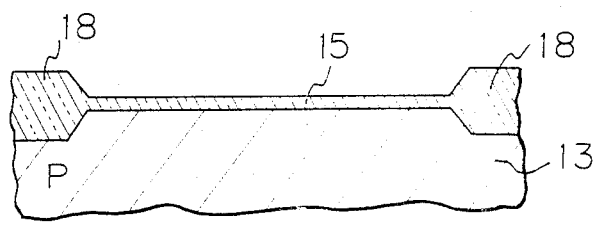

Referring to FIGS. 4$a$ and 4$b$, the surface of the active layer 21 is oxidized to form the gate insulating layer 15 of silicon dioxide with a thickness of about 75 nm.

Figure 5A:
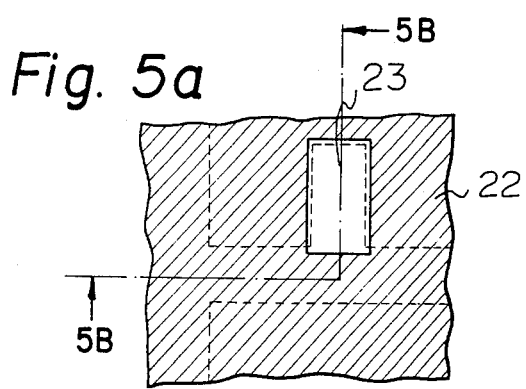
Figure 5B:
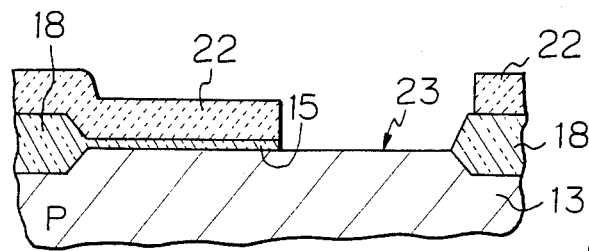

Referring to FIGS. 5$a$ and 5$b$, a resist 22 covers the entire surface and is patterned. A part of the gate insulating layer 15 is then wet etched to form a writing and erasing region 23 with an etchant of, e.g., the hydrogen fluoride system, using the resist 22 as a mask.

Figure 6A:
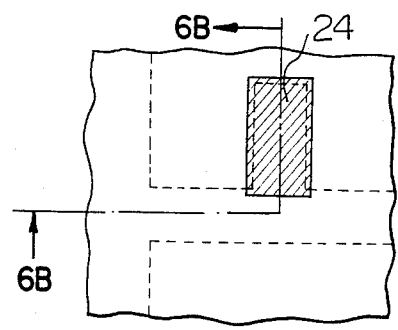
Figure 6B:
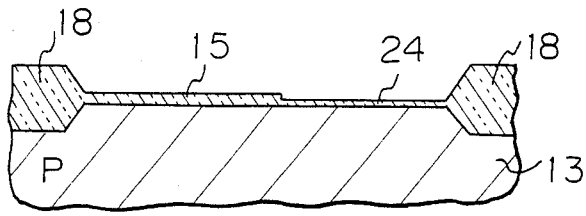

Referring to FIGS. 6$a$ and 6$b$, the surface of the substrate 13 in the writing and erasing region 23 is oxidized to form a very thin silicon dioxide layer 24 of a thickness of about 13 nm.

Figure 7A:
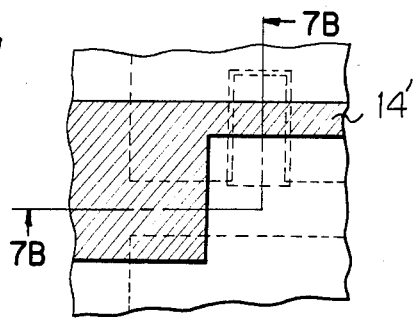
Figure 7B:
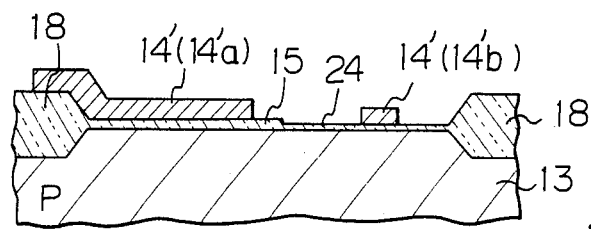

Referring to FIGS. 7$a$ and 7$b$, a first polysilicon layer 14' having a 400 nm thickness is deposited by chemical vapor deposition (CVD) and patterned to form a preform 14' (14'$a$ and 14'$b$) of the floating gate 14 it comprises the reading portion 14$a$ and the writing and erasing portion 14$b$, the latter having a width of about 1 to 2 $\mu$m. The thus formed preform pattern is somewhat wider than the final floating gate pattern comprising the two portions.

Figure 8A:
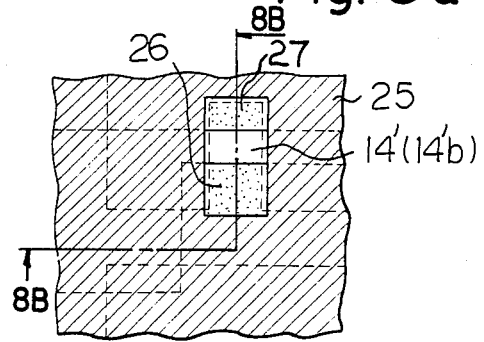
Figure 8B:
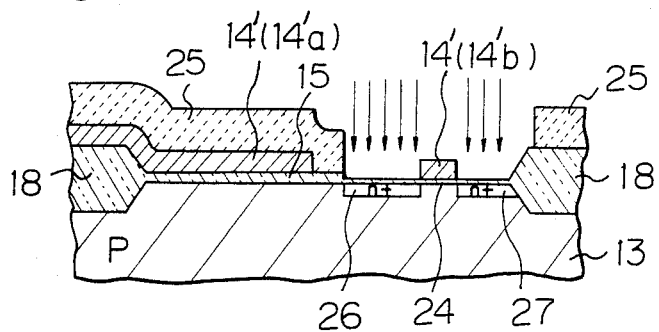

Referring to FIGS. 8$a$ and 8$b$, a resist 25 having a 1 to 2 $\mu$m thickness is coated over the entire surface and selectively etched off in the writing and erasing region 23. Ion implantation of phosphorus is then effected at an accelerating voltage of 80 keV and a dosage of $1 \times 10^{15}$ ions/cm$^2$ through the thin silicon dioxide layer 24 with the resist 25 and the first polysilicon layer 14'(14$b$') acting as masks. Thus implanted ions enter into the first polysilicon layer 14'. This ion implantation forms phosphorus-doped regions 26 and 27 in the substrate 13.

Referring to FIGS. 9$a$ and 9$b$, the resist 25 is removed. Heat treatment is then effected at a temperature of 1200° C. for several minutes to oxidize the surface of the first polysilicon layer 14' to form the insulating layer 17' as well as to increase the thickness of the thin silicon dioxide layer 24 at both sides of the first polysilicon layer 14'$b$ in the writing and erasing region 23. These oxidized (silicon dioxide) layers have a thickness of about 75 nm. By this heat treatment, phosphorus ions in the two regions 26 and 27 are three-demensionally diffused, resulting in expansion of the phosphorus-doped regions and the mutual combination thereof to form a single phosphorus-doped region 28 including the entire region just under the first polysilicon layer 14$b$' in the writing and erasing region 23, since phosphorus ions can diffuse at least about 1 $\mu$m in width. This is important for the operation of a floating-gate injection-type EEPROM, for the reason described before. After this heat treatment, a tunneling insulating layer 19 having a 13 nm thickness is finished only under the first polysilicon layer 14$b$ in the writing and erasing region 23 since the thin silicon dioxide layer 24 at both sides of the first polysilicon layer 14$b$ is thickened as mentioned above.

Referring to FIGS. 10$a$ and 10$b$, a second polysilicon layer having a 400 nm thickness is deposited over the entire surface by CVD and is patterned to form the control gate 16 comprising the reading portion 16$a$ and the writing and erasing region 16$b$. At this stage, the second polysilicon layer 16', the silicon dioxide layer 17' under the second polysilicon layer 14', and the first polysilicon layer 14' are patterned by a double self-alignment process, resulting in the final control gate 16 (16$a$ and 16$b$), insulating layer between the gates, and floating gate 14 (14$a$ and 14$b$). In FIG. 10$a$, the pattern of the control gate 16 is shown by a hatched region, and the pattern of the floating gate 14 after the double self-alignment process is shown by a dotted region.

Figure 11A:
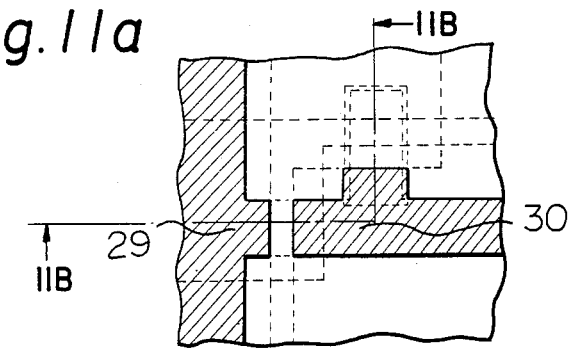
Figure 11B:
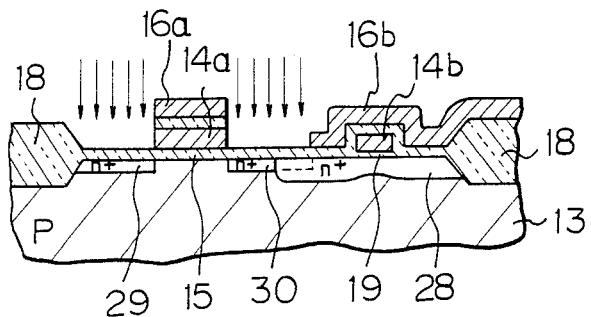

Referring to FIGS 11$a$ and 11$b$, ion implantation of phosphorus is effected at a accelerating voltage of 80 keV and a dosage of $1 \times 10^{15}$ ions/cm$^2$ by using the field oxide layer 18 and the floating and controlling gates 14 and 16 as masks, and thus resulting in phosphorus ion implanted regions 29 and 30. The implanted ions enter into polysilicon layer 16$a$. After this, heat treatment is effected at a temperature of 1200° C. for several minutes to cover the gates 14 and 16 of polysilicon with a silicon dioxide layer as well as to diffuse phosphorus ions to form th source region 11 and the drain region 12 as seen in FIG. 2, the latter being formed by combination of the regions 28 and 30.

Thus, a floating-gate tunnel-injection type EEPROM as shown in FIG. 2 is obtained. The processes after this are conventional.

Figure 12:
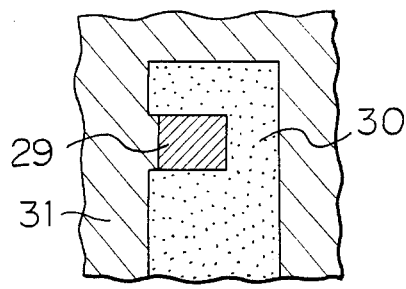
FIGS. 12 and 13 show other patterns of a tunneling-insulating layer and neighboring regions from where a doping impurity is to be diffused.
Figure 13:
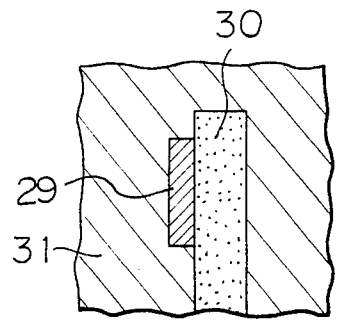

The above description, of course, is an example and is not meant to limit the scope of the present invention. FIGS. 12 and 13 are other examples of a pattern of a tunneling insulating layer, in which a tunneling insulating layer 29 having a very thin thickness is surrounded by one or more regions 30 (one region is shown in figs.) from where doping impurity is diffused into the entire region just under the tunneling insulating layer, in other than two sides of the tunneling insulating layer (three sides in FIG. 12 and one side in FIG. 13). In these figures, reference numeral 31 denotes a thick insulating layer. These tunneling insulating layers 29 should have a relatively narrow width since the doping impurity must diffuse into the entire region just under the tunneling insulating layers 29.

Diffusion into a region of the substrate, comprising the entire region under a tunneling-insulating layer, may be effected by a single heat diffusion process, from above the substrate through another region of the substrate neighboring said region under the tunneling insulating layer.

I claim:

1. A method for fabricating a floating-gate tunnel injection type electrically erasable programmable read only memory, including the steps of:
forming an insulating layer on a semiconductor substrate;

forming a floating gate extending onto the insulating layer, the area under the floating gate defining a tunneling insulating layer; and then introducing a doping impurity into first and second regions of the substrate, the second region of the substrate comprising the entire region under the tunneling insulating layer on which the floating gate is formed, the first region of the substrate neighboring the second region of the substrate, the doping impurity being introduced into the second region through the first region from above the substrate.

2. A method according to claim 1, wherein the step of introducing a doping impurity into the first region as well as into the entire second region comprises a first process of ion implanting the doping impurity into the first region and a second process of heat diffusing the doping impurity into the entire second region from the first region.

3. A method according to claim 1, wherein the step of introducing a doping impurity into the first region as well as into the entire second region is completed by a single process of heat diffusion of the doping impurity through the top surface of the first region.

4. A method according to claim 1, wherein the doping impurity is introduced into the first region of the substrate on both sides of the floating gate as well as into the entire second region of the substrate just under the tunneling insulating layer under the floating gate by diffusion from both sides of the second region.

5. A method according to claim 1, wherein the floating gate on the tunneling insulating layer has a width of from about 1 $\mu$m to 2 $\mu$m.

6. A method according to claim 1, wherein the tunneling insulating layer is silicon dioxide.

* * * * *